United States Patent [19]

Sugihara et al.

[11] Patent Number: 4,684,976
[45] Date of Patent: Aug. 4, 1987

[54] FEEDBACK COMB-TYPE FILTER

[75] Inventors: Shoichi Sugihara; Sumio Katoh, both of Nagaokakyo, Japan

[73] Assignee: Mitsubishi Denki Kabushiki Kaisha, Tokyo, Japan

[21] Appl. No.: 852,207

[22] Filed: Apr. 15, 1986

[30] Foreign Application Priority Data

| Apr. 18, 1985 | [JP] | Japan | 60-83513 |
| Aug. 8, 1985 | [JP] | Japan | 60-174485 |
| Aug. 30, 1985 | [JP] | Japan | 60-192513 |

[51] Int. Cl.$^4$ .................. H04N 9/78; H04N 5/213
[52] U.S. Cl. ................................. 358/31; 358/36; 358/167
[58] Field of Search ............... 358/31, 36, 340, 167

[56] References Cited

U.S. PATENT DOCUMENTS

| 3,836,707 | 9/1974 | Murakami et al. | 358/31 |
| 4,074,321 | 2/1978 | Miller | 358/31 |
| 4,096,516 | 6/1978 | Pritchard | 358/31 |
| 4,143,397 | 3/1979 | Holmes | 358/31 |
| 4,443,817 | 4/1984 | Faroudja | 358/167 |
| 4,607,285 | 8/1986 | Hirota et al. | 358/340 |

FOREIGN PATENT DOCUMENTS 150669 11/1980 Japan ........................... 358/167

OTHER PUBLICATIONS

IEEE Trans., CE-29, 179-94-Yamashita et al, (Aug. 1983) New Systems for Video Processing ICs.

Primary Examiner—John W. Shepperd
Attorney, Agent, or Firm—Burns, Doane, Swecker & Mathis

[57] ABSTRACT

This invention relates to a feedback comb-type filter used for improving the S/N ratio of video signals and so constructed as to delay the output of a coefficient multiplier and to get a feedback delay signal contrary to the conventional one which gives to the coefficient multiplier the filter output, that is, the signal to be output to the exterior, thereby enabling to improve the S/N ratio only by varying the coefficient of the coefficient multiplier, also constructed to be able to cut off the feedback delay signal to suppress generation of pseudo signal and use one low pass filter for both the delay circuit and the limit of horizontal frequency band to reduce the components in number, thereby expecting improvements in accuracy and reliability.

17 Claims, 5 Drawing Figures

FEEDBACK COMB-TYPE FILTER

BACKGROUND OF THE INVENTION

1. Field of the Invention

The present invention relates to a comb-type filter, and more particularly to a feedback comb-type filter used to improve a signal-to-noise (S/N) ratio of a video signal.

2. Description of the Prior Art

In order to improve the signal-to-noise (S/N) ratio of the video signal in video camera, video recorders and the like, the feedback comb-type filter is mainly used.

FIG. 5 is a block diagram of a feedback comb-type filter reported in the "process and picture quality of the video signal by the comb-type filter" in NHK Technical Research Monthly Report, April, 1968. Next, explanation will be given on construction and operation for improving the S/N ratio of the conventional feedback comb-type filter in accordance with FIG. 5.

In FIG. 5, reference numeral 1 designates an input terminal of the video signal, 2 designates an adder whose first input terminal is connected to the input terminal 1 of the video signal, 3 designates a one horizontal time (hereinafter referred to as 1H) delay circuit which is given an output signal of the adder 2 and outputs the inputted signal after delaying of the duration corresponding to 1H, the 1H delay circuit 3 comprising a delay unit 31 and a low pass filter 32 connected in series with each other, and 4 designates an adder whose first terminal is given the output of the 1H delay circuit 3 and whose second terminal is connected to the input terminal 1 of the video signal and given the video signal $V_i$, the adder 4 introducing its output signal to a signal output terminal 6 and a coefficient multiplier 5, so that the output signal from the adder 4 is introduced to the coefficient multiplier 5 and multiplied therein by a feedback coefficient so as to be given to the second input terminal of the adder 2. Reference numeral 7 designates a level adjusting circuit for introducing therein an output signal of the adder 4 through the signal output terminal 6 and adjusting the inputted signal so as to output it to an adjusted signal output terminal 8.

Such conventional feedback comb-type filter obtains a feedback delay signal by introducing to the coefficient multiplier 5 the output of the circuit and operates as follows:

Now, when a signal level at the video signal input terminal 1 is represented by $V_i$, an input signal level of the 1H delay circuit 3 by $V_H$, the signal of the signal output terminal 6 by $V_o$, the feedback coefficient of the coefficient multiplier 5 by K, and the transfer function of the 1H delay circuit 3 by G, the following equations should hold:

$$V_H = V_i + KV_o \quad (1)$$

$$V_o = V_i + GV_H \quad (2)$$

By eliminating $V_H$ from the equations (1) and (2), the relation between the output signal $V_o$ and the input signal $V_i$ is decided and given in the following equation:

$$V_o = \frac{1+G}{1-KG} V_i \quad (3)$$

wherein $$\frac{1+G}{1-KG}$$

is the transfer function of the filter constructed as shown in FIG. 5. The transfer function G of the 1H delay circuit 3, when a television signal larger in line correlation is processed, need only be $\tau_L = 1/f_L$ (where $\tau_L$: delay time and $f_L$: line frequency) and is given in $$G = e^{-j\omega\tau_L} = \cos\omega\tau_L - j\sin\omega\tau_L.$$

Accordingly, the transfer function in the equation (3) is representable in the following equation:

$$\frac{1+G}{1-KG} = \frac{1 + \cos\omega\tau_L - j\sin\omega\tau_L}{1 - K\cos\omega\tau_L + jK\sin\omega\tau_L} \quad (4)$$

Assuming that n is a plus integer, the equation (4) represents that the output level of the filter shown as FIG. 5 becomes $2/(1-K)$ times of input signal level in case the frequency f of input signal has the relation such as $f = nf_L$, and that becomes 0 in case frequency f of input signal has the relation such as $f = (n+\frac{1}{2}) \cdot f_L$, which indicate that the filter constructed as shown in FIG. 5 is a comb-type filter which produces a loop at a portion of an n multiple in the line frequency. Also, by varying the feedback coefficient K, the sharpness of the amplitude frequency characteristic of the filter changes, which represents that the improvement factor in the S/N ratio can freely be set.

The 1H delay circuit 3 comprises a delay unit 31 and a low pass filter 32 for eliminating needless signals, such as sampling pulse leakage, from the delay unit 31, and is set so that the sum of delay time of both the delay unit 31 and low pass filter 32 becomes 1H.

Also, the level adjusting circuit 7 is provided in order that the signal $V_o$ from the signal output terminal 6, which is the function of the feedback coefficient K, is multiplied by $(1-K)$, thereby not causing variation in the output amplitude, regardless of variation in the feedback coefficient K, in the signal being outputted from the adjusted signal output terminal 8.

The conventional feedback comb-type filter thus changes the feedback coefficient K of the coefficient multiplier 5, thereby changing the improvement factor for S/N ratio, and when the feedback coefficient K is changed, the multiplier $(1-K)$ of the level adjusting circuit as a matter of course must be changed. However, it is difficult to obtain the consistency of the coefficient multiplier 5 and level adjusting circuit 7, whereby it has substantially been difficult to change the feedback coefficient of the coefficient multiplier 5, in other words, to vary the improvement factor for S/N ratio.

When the introduced video signal has no line correlation, a problem of generation of the pseudo signal has been created. Furthermore, a problem has been that another low pass filter other than that for the delay circuit was required for limiting the horizontal frequency band.

SUMMARY OF THE INVENTION

In order to solve the above problems, the present invention has been designed.

A first object thereof is to provide a feedback comb-type filter which need no level adjusting circuit in order to change the feedback coefficient K of the coefficient multiplier easily, thereby enabling the improvement factor of S/N ratio to be changed with ease.

A second object of the invention is to provide a feedback comb-type filter which generates no pseudo signal even when the video signal having no line correlation is introduced.

A third object of the invention is to provide a feedback comb-type filter so constructed as to have in common use the low pass filter for the delay circuit and that for limiting the horizontal frequency band, thereby reducing the number of parts and improving the certainty and reliability for operation.

A fourth object of the invention is to provide a feedback comb-type filter easy to change the circuit constitution, more concretely, one component is exchanged to form the filter in either a Y-type or a C-type.

A feedback comb-type filter of the present invention is characterized by comprising an operation means which has a first input terminal being input the video signals and a second input terminal, a coefficient multiplier for multiplying the output of said operation means by a coefficient K, a subtracter whose subtracting input terminal is given the output of said coefficient multiplier and whose subtracted input terminal is given the output of said operation means, and a delay circuit for delaying the output of said coefficient multiplier by the duration corresponding to one horizontal scanning period of the video signal, whereby said operation means operates the video signals being input from said first input terminal and delayed output of said delay circuit delayed by the duration corresponding to one horizontal scanning period of the video signal, and said subtracter subtracts the signal which is the operation result of said operation means being multiplied by the coefficient K by said coefficient multiplier from the operation result of said operation means, so that the subtraction result of said subtracter is output as the filter output.

The above and further objects and features of the invention will more fully be apparent from the following detailed description with accompanying drawings.

DESCRIPTION OF THE PREFERRED EMBODIMENT

Next, explanation will be given on the feedback comb-type filter of the invention by reference to the drawings.

Figure 1:
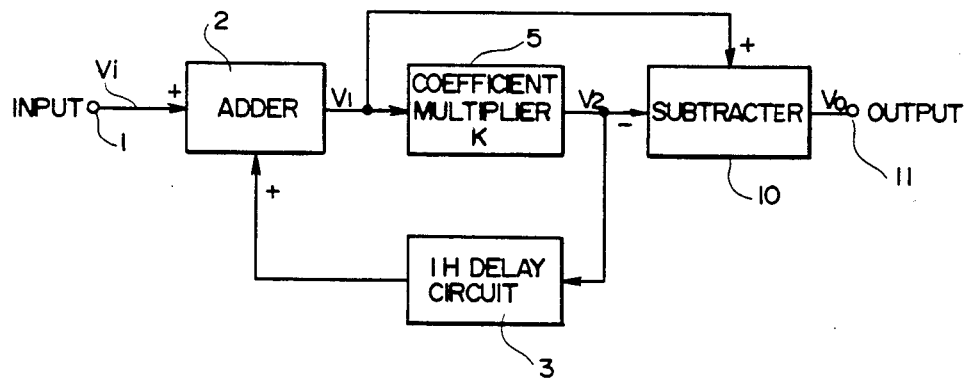
FIG. 1 is a block diagram of a first embodiment of a feedback comb-type filter of the invention.

FIG. 1 is a block diagram of the feedback comb-type filter of the present invention.

Figure 5:
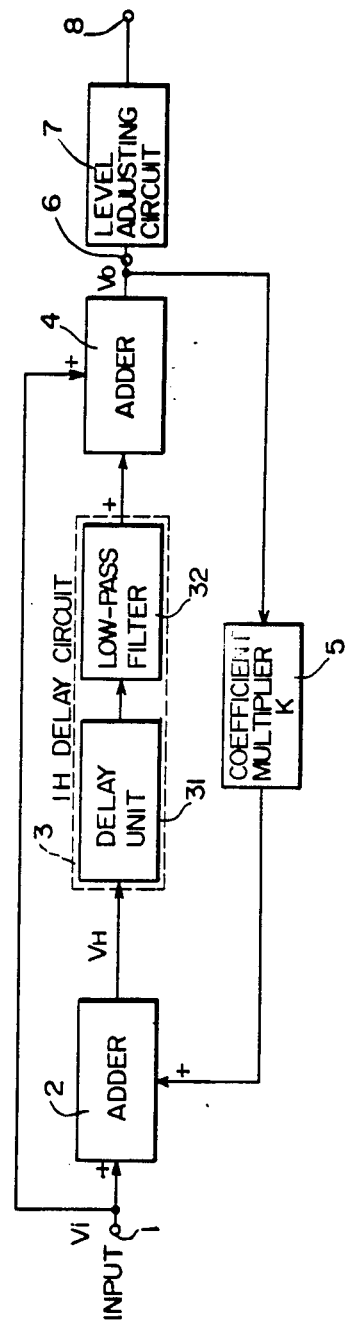
FIG. 5 is a block diagram of the conventional feedback comb-type filter.

In FIG. 1, the components indicated with same reference numerals as those in FIG. 5 designate the same construction components of the conventional example.

In FIG. 1, reference numeral 1 designates a video signal input terminal, 2 designates an adder as an operation means, 3 designates 1H (one horizontal time) delay circuit, 5 designates a coefficient multiplier, 10 designates a subtracter, and 11 designates a signal output terminal.

The video signal input terminal 1 in which the video signal is introduced is connected to a first input terminal of the adder 2, an output therefrom is introduced into the coefficient multiplier 5 and also into a subtracted input terminal (shown by a symbol + in the drawing). An output of the coefficient multiplier 5 is introduced into a subtracting input terminal (shown by a symbol − in the drawing) of the subtracter 10 and also into the 1H delay circuit 3. An output of the 1H delay circuit 3 is given to the second input of the adder 2, and the output of the subtracter 10 is connected to the signal output terminal 11. Such circuit of the invention obtains a feedback delay signal from the coefficient output. In addition, in the first embodiment, an adder, which outputs two inputs after adding each other therein, is used as a subtracter, however, a subtracter can also be used as is mentioned later.

Next, explanation will be given on operation of the filter shown in FIG. 1. When the level of input signal into the video signal input terminal 1 is represented by $V_i$, the level of the output signal from the adder 2, that is, the input signal to the coefficient multiplier 5 and also that of the subtracted input signal to the subtracter 10 by $V_1$ respectively, the level of the output signal of the coefficient multiplier 5, that is, the subtracting input signal to the subtracter and also that of the input signal to the 1H delay circuit by $V_2$, the level of the output of the subtracter 10, that is, the output signal of the signal output terminal 11 by $V_o$, the feedback coefficient of the coefficient multiplier 5 by K, and the transfer function of the 1H delay circuit 3 by G, the following equations (5) and (6) should hold.

$$V_o = V_1 - V_2 = (1-K)V_1 \qquad (5)$$

$$V_1 = V_i = GV_2 = V_i + KGV_1 \qquad (6)$$

By eliminating $V_1$ from the equations (5) and (6), the following equation (7) as the relation between the input signal level $V_i$ and the output signal level $V_o$ should hold:

$$V_o = \frac{1-K}{1-KG} \cdot V_i \qquad (7)$$

The transfer function $$\frac{1-K}{1-KG}$$

of the equation (7) is given in the following equation:

$$\frac{1-K}{1-KG} = \frac{1-K}{1 - K\cos\omega\tau_L + jK\sin\omega\tau_L} \qquad (8)$$

The right side of equation (8), when n is assumed to be a plus integer, represents that the output of the filter shown as FIG. 1 becomes 1 time of input signal level in case the frequency f of input signal has the relation such as $f = n \cdot f_L$, and that becomes $$\frac{1-K}{1+K}$$

times in case frequency f of input signal has the relation such as $f = (n + \frac{1}{2})f_L$. This means that the circuit shown in FIG. 1 is a comb-type filter producing an anti-node at the portion of n multiple of the line frequency $f_L$ in the same way as the conventional example shown in FIG. 5. When $f = n \cdot f_L$, the signal level at the anti-node is 1 and not related to the value of K. Hence, the value of K, even when changed, does not affect the amplitude of output signal from the signal output terminal 11, thereby not requiring the level adjusting circuit 7 which has been required to the conventional example shown in FIG. 5.

Accordingly, the feedback coefficient K of coefficient multiplier 5 is made variable from the exterior thereof and even when it is actually varied, the improvement factor for S/N ratio is variable with ease only by varying the feedback coefficient K because no level adjusting circuit 7.

Figure 2:
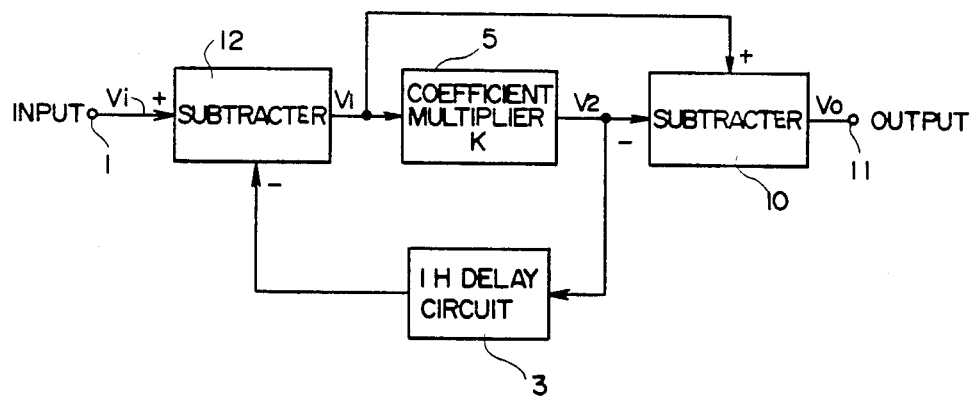
FIGS. 2, 3 and 4 are block diagrams of another embodiment of the feedback comb-type filter of the invention respectively.

The explanation about the above embodiment of the Y-type feedback comb-type filter with the anti-node being at the portion of n multiple of the line frequency and with the comb shape at the $(n+\frac{1}{2})$ multiple has been given. When the filter is so constructed as that the adder 2 shown in FIG. 1 is replaced by a subtracter 12 as shown in FIG. 2 which conducts subtraction by using the signal at the video signal input terminal 1 as the subtracted signal and the output signal of the 1H delay circuit 3 as the subtracting signal, it is easy to consider that the filter becomes C-type comb-type one with the comb shape being formed at the portion of n multiple of the line frequency and with the anti-node at the portion of $(n+\frac{1}{2})$ multiple of the same, thereby clarifying that the effect as same as the above embodiment is obtained.

Figure 3:
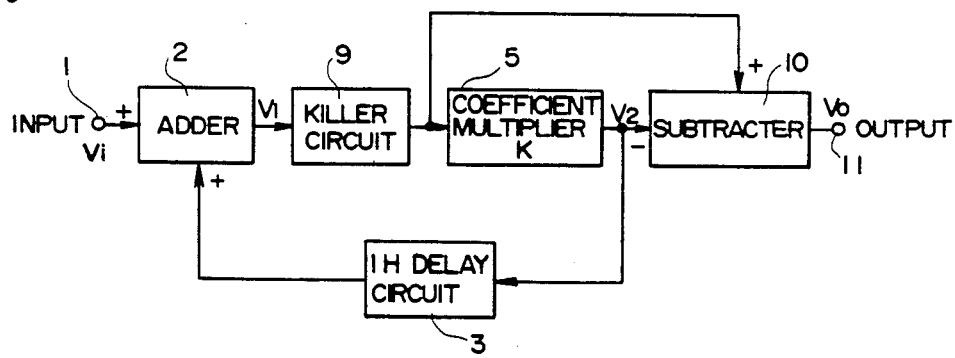

FIG. 3 is a block diagram of a second embodiment of the feedback comb-type filter of the invention. It is so constructed that the output of the adder 2 of the first embodiment shown in FIG. 1 is once introduced into a killer circuit 9 and thereafter into the coefficient multiplier 5 and the subtracted input of the subtracter 10.

In the second embodiment of the feedback comb-type filter of the invention, the reason of constructing in such a way as the above-mentioned is that the first embodiment shown in FIG. 1, when the input video signal to the video signal input terminal 1 has not the vertical correlation, is possible to generate the pseudo signal, whereby the second embodiment is intended to prevent the generation.

In other words, in the second embodiment shown in FIG. 3, when the input video signal to the video signal input terminal 1 has the vertical correlation, the level $V_1$ of the output signal from the killer circuit 9 being the same as that of the output signal from the adder 2, the second embodiment operates in the same way as the first embodiment shown in FIG. 1. On the contrary, when the video signal having no vertical correlation is introduced into the video signal input terminal 1, the aforesaid equations (5) through (8) should not hold and the pseudo signal is generated.

Hence, in the latter case, the killer circuit 9 cuts off a feedback loop comprising the coefficient multiplier 5, 1H delay circuit 3 and adder 2, leading no signal being outputted from the signal output terminal 11, thereby inhibiting generation of the pseudo signal.

In addition, in the second embodiment, a subtracter can also be used in place of the adder 2 in the same way as the first embodiment, a C-type feedback comb-type filter is similarly constructed.

Figure 4:
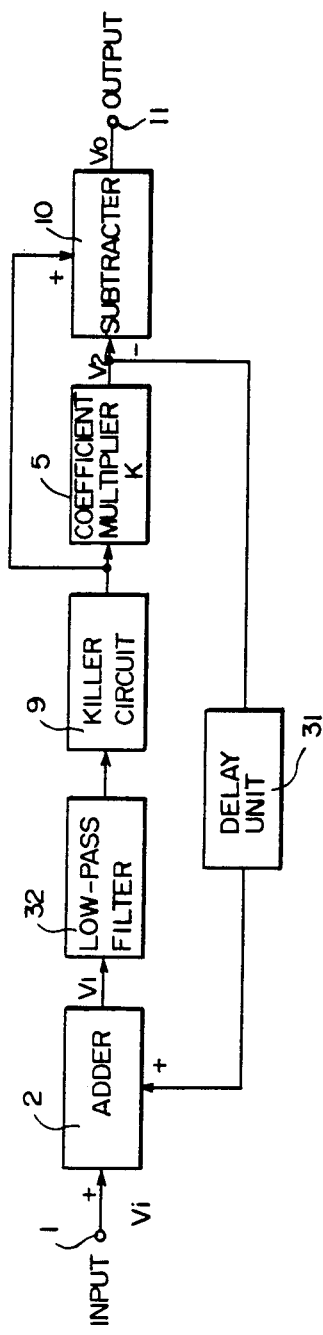

FIG. 4 is a block diagram of a third embodiment of the feedback comb-type filter of the invention.

In this embodiment, the 1H delay circuit 3, which is shown in the first and second embodiments in FIGS. 1 and 3, actually in the conventional example shown in FIG. 5, comprises the delay unit 31 and low pass filter 32 being connected in series, uses only the delay unit 31, the low pass filter 32 being connected in series between the adder 2 and the killer circuit 9.

In the third embodiment, when the level of video signal introduced into the video signal input terminal 1 is represented by $V_i$, that of output signal from the adder 2 by $V_1$, that of the coefficient multiplier 5 by $V_2$, that of output signal from the signal output terminal 11, that is, the subtracter 10, by $V_o$, the transfer function of the low pass filter 32 by $G_1$, the same of the delay unit 31 by $G_2$, and the feedback coefficient by K, the following equations (9) and (10) should hold:

$$V_o = G_1 V_1 - V_2 \qquad (9)$$
$$= G_1 V_1 - K G_1 V_1$$
$$= (1 - K) G_1 V_1$$
$$V_1 = V_i + G_2 V_2 \qquad (10)$$
$$= V_i + K G_1 G_2 V_1$$

When $V_1$ is eliminated from the equations (9) and (10), between the input signal level $V_i$ to the video signal input terminal 1 and the output signal level $V_o$ from the signal output terminal 11, the following equation (11) should hold:

$$V_o = \frac{1-K}{1-KG_1G_2} \cdot G_1 \cdot V_i \qquad (11)$$

Now, the delay times of the low pass filter 32 and delay unit 31 are represented by $\tau_1$ and $\tau_2$ so that the sum of $\tau_1$ and $\tau_2$ becomes 1H, then $G_1G_2$ in a denominator of the equation (11) is represented as follows:

$$G_1 G_2 = e^{-j\omega\tau_1} \cdot e^{-j\omega\tau_2}$$
$$= e^{-j\omega(\tau_1+\tau_2)}$$
$$= e^{-j\omega\tau_L}$$
$$= G,$$

where G represents transfer function of 1H delay circuit 3 shown in the first, second embodiments and conventional example, and $\tau_L$ represents the delay time of the 1H delay circuit.

Hence, the equation (11) can be rewritten into the following equation (12):

$$V_o = \frac{1-K}{1-KG} \cdot G_1 \cdot V_i \qquad (12)$$

The transfer function $$\frac{1-K}{1-KG} \cdot G_1$$

in an equation (12), when deemed the same as the equation (8), depends upon $G_1$ in case the frequency f of input signal has the relation such as $f = n \cdot f_L$, and becomes $$\frac{1-K}{1+K} \cdot G_1$$

in case $f = (n+\frac{1}{2}) f_L$, which indicates, in as the same way as each aforesaid embodiment and the conventional feedback comb-type filter shown in FIG. 5, that the anti-node is formed at the portion of n multiple of the line frequency and the comb shape is formed at the portions of (n+½) multiple of the same.

Also, $G_1$ in the equation (12) is the transfer function of the low pass filter 32, and it will be understood that the low pass filter 32 serves to eliminate needless signals in the delay unit 31 and limit the horizontal frequency band of the entire filter.

On the other hand, in the embodiment shown in FIG. 4, when the video signal having no vertical correlation is introduced into the video signal input terminal 1, the equations (9) through (12) should not hold and the pseudo signal is generated in the same way as the former embodiments. Also, in this case, the killer circuit 9 cuts off the feedback loop to suppress the pseudo signal in the same way as the above.

In addition, in the embodiment shown in FIG. 4, when the subtracter is used in place of adder 2, a C-type feedback comb-type filter is constructed in the same way as the above embodiments.

The killer circuit 9 in the above embodiment provided at the output side of the low pass filter 32 may alternatively be provided at the input side thereof, which has the same effect as the embodiment shown in FIG. 4.

As seen from the above, the feedback comb-type filter of the invention is effective in that the value of feedback coefficient K to decide the improvement factor of S/N ratio can freely be set without using the level adjusting circuit, one low pass filter can serve enough while the conventional has needed two, and the generation of pseudo signal is suppressed.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A feedback comb-type filter for forming a sequence of narrow pass bands or narrow stop bands centered at multiples of some specified frequency by insertion loss thereof, comprising:
   an operation means which has a first input terminal being input the video signals and a second input terminal;
   a coefficient multiplier for multiplying the output of said operation means by a coefficient K;
   a subtracter whose subtracting input terminal is given the output of said coefficient multiplier and whose subtracted input terminal is given the output of said operation means; and
   a delay circuit for delaying the output of said coefficient multiplier by the duration corresponding to one horizontal scanning period of the video signal;
   whereby said operation means operates the video signals being input from said first input terminal and delayed output of said delay circuit delayed by the duration corresponding to one horizontal scanning period of the video signal, and
   said subtracter subtracts the signal which is the operation result of said operation means being multiplied by the coefficient K by said coefficient multiplier from the operation result of said operation means, so that the subtraction result of said subtracter is output as the filter output.

2. A feedback comb-type filter as set forth in claim 1, wherein said operation means is an adder which adds the inputs being input from both said first and second input terminals thereof.

3. A feedback comb-type filter as set forth in claim 1, wherein said operation means is a subtracter which subtracts the delayed output of said delay circuit received at said second input terminal as the subtracting signal from the video signals received at said first input terminal as the subtracted signal.

4. A feedback comb-type filter as set forth in claim 1, which comprises a killer circuit connected between said operation means and said coefficient multiplier for attenuating or cutting off the output of said operation means when the video signals are not correlated with each other in a vertical direction on the screen.

5. A feedback comb-type filter as set forth in claim 4, wherein said operation means is an adder which adds the inputs being input from both said first and second input terminals thereof.

6. A feedback comb-type filter as set forth in claim 4, wherein said operation means is a subtracter which subtracts the delayed output of said delay circuit received at said second input terminal as the subtracting signal from the video signals received at said first input terminal as the subtracted signal.

7. A feedback comb-type filter as set forth in claim 1, which comprises a low pass filter connected between said operation means and said coefficient multiplier for limiting a horizontal frequency band of the video signals and for cutting off noise components contained in the output of said delay circuit.

8. A feedback comb-type filter as set forth in claim 7, wherein said operation means is an adder which adds the inputs being input from both said first and second input terminals thereof.

9. A feedback comb-type filter as set forth in claim 7, wherein said operation means is a subtracter which subtracts the delayed output of said delay circuit received at said second input terminal as the subtracting signal from the video signals received at said first input terminal as the subtracted signal.

10. A feedback comb-type filter as set forth in claim 7, wherein the sum of the delayed time of said low pass filter and the delayed time of said delay circuit corresponds to one horizontal scanning period of the video signal.

11. A feedback comb-type filter as set forth in claim 1, which comprises a serial connected circuit connected between said operation means and said coefficient multiplier and having a killer circuit for cutting off an output of said operation means when the video signals are in uncorrelation each other in a vertical direction on the screen each other and a low pass filter for limiting a horizontal frequency band of the video signals and for cutting off noise components contained in the output of said delay circuit.

12. A feedback comb-type filter as set forth in claim 11, wherein said operation means is an adder which adds the inputs being input from both said first and second input terminals thereof.

13. A feedback comb-type filter as set forth in claim 11, wherein said operation means is a subtracter which subtracts the delayed output of said delay circuit received at said second input terminal as the subtracting signal from the video signals received at said first input terminal as the subtracted signal.

14. A feedback comb-type filter as set forth in claim 11, wherein the sum of the delayed time of said low pass filter and the delayed time of said delay circuit corresponds to one horizontal scanning period of the video signal.

15. A feedback comb-type filter as set forth in claim 11, wherein the input of said series connected circuit is input to said low pass filter and the output of the same is the output of said killer circuit.

16. A feedback comb-type filter as set forth in claim 11, wherein the input of said series connected circuit is input to said killer circuit and the output of the same is the output of said low pass filter.

17. A feedback comb-type filter as set forth in claim 1, wherein the coefficient of said coefficient multiplier is variable from the exterior of said filter.

* * * * *